_United States Patent_ [19]

Meier

[11] Patent Number: 4,868,288

[45] Date of Patent: Sep. 19, 1989

[54] PROCESS FOR PREPARING METALLOCENE COMPLEXES

[75] Inventor: Kurt Meier, Allschwil, Switzerland

[73] Assignee: Ciba-Geigy Corporation, Ardsley, N.Y.

[21] Appl. No.: 257,152

[22] Filed: Sep. 30, 1988

[30] Foreign Application Priority Data

May 19, 1982 [GB] United Kingdom ................. 8214610

[51] Int. Cl.$^4$ ........................... G03C 1/68; C08F 4/42; C08G 59/68; C07F 17/00
[52] U.S. Cl. ......................................... 534/15; 556/43; 556/46; 556/52; 556/53; 556/58; 556/70; 556/87; 556/140; 556/143; 556/1
[58] Field of Search ...................... 534/15; 556/143, 53

[56] References Cited

U.S. PATENT DOCUMENTS 3,130,214  4/1964  Coffield et al. ................. 556/140 X
3,190,902  6/1965  Coffield et al. ...................... 556/140

FOREIGN PATENT DOCUMENTS 0094915  11/1983  European Pat. Off. .

OTHER PUBLICATIONS

_Chem. Communications_, p. 930, 1971, J. F. Helling et al., "New, Improved Syntheses of Bisbenzeiron (II) Hexafluorophosphate and Related Compounds".
Sutherland et al., Journal of Organometallic Chemistry, 101, 221–29 (1975).
Nesmeyanou et al., Koord. Klim., 1, 1252–56 (1975).
Astruc et al., C.R. Academ. Sc. Paris, Series C, 272 1337 (1971).
Schumann, Chemukev Zeitung, 108(11) 345–373 (1984).
Schumann, Chenukev Zeitung, 108(7/8), 239–251 (1984).
Astruc et al., Tetrahedron, 32 245–49 (1976).

_Primary Examiner_—Brooks H. Hunt
_Assistant Examiner_—Virginia B. Caress
_Attorney, Agent, or Firm_—Harry Falber

[57] ABSTRACT

The invention relates to a process for the preparation of compounds of formula Ia

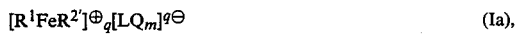

$$[R^1FeR^{2'}]^{\oplus}{}_q[LQ_m]^{q\ominus} \qquad (Ia),$$

wherein $R^1$ is a $\pi$-arene, $R^{2'}$ is an anion of a $\pi$-arene, L is a divalent to heptavalent metal or non-metal, Q is a halogen atom, q is an integer from 1 to 3 and m is an integer corresponding to the valency of L+q, said process comprises reacting an uncharged $\pi$-complex of the formula IIIa

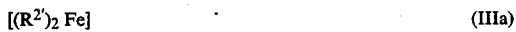

$$[(R^{2'})_2 Fe] \qquad (IIIa)$$

with a $\pi$arene $R^1$ is in the presence of Al and a Lewisacid followed by treatment with an acid or a salt of an acid of the anion $[LQ_m]^{q-}$, the improvement consisting essentially of using TiCl$_4$ as a Lewis-acid.

2 Claims, No Drawings

PROCESS FOR PREPARING METALLOCENE COMPLEXES

This is a continuation-in-part application of our copending application Ser. No. 492,851, filed May 9, 1983.

The present invention relates to a process for preparing metallocene complexes that can be used as initiators for the polymerization of cationically polymerizable organic material.

Different iodonium, sulfonium and diazonium salts are known as photoinitiators for cationically polymerisable organic materials from the literature (q.v. for example German Auslegeschrift No. 25 18 639, J. Polym. Sci., Polymer Chemistry Ed., 17, 1059 (1979), Makromol. Chem., Suppl. 3, 348 (1979), German Offenlegungsschrift specification Nos. 25 20 489, 28 54 011, 30 21 376, U.S. patent specification No. 4 210 449 and British patent application No. 2.046.269A). On account of their relatively low absorption range (about 190 to 400 nm), these known photoinitiators require the use of sensitisers such as coloured polycyclic hydrocarbons, e.g. perylene dyes, aromatic amines, benzoin alkyl ethers or alkoxyacetophenones, for curing cationically polymerisable systems under the action of light. The heat-curing of systems containing such photoinitiators is conveniently carried out in the presence of reducing agents such as copper, tin, iron or cobalt salts, thiophenols, ascorbic acid and the like.

The preparation of iron-arene complexes by ligand-exchange reactions in the presence of a Lewis-acid catalyst has been described in Chem. Comm., 1971, 1071 and in Can. J. Chem., 57, 933 (1979). There are used $AlCl_3$ or $BF_3$-etherate as Lewis-acids.

From J. Organomet. Chem., 88, 207 (1975) the stereospecific ring-protonation of bis-indenyliron and the subsequent isolation of the corresponding hexafluorophosphate salt is known.

In none of these references a suggestion is made to use these metallocene salts as initiators of the cationic polymerization.

It is the object of the present invention to provide a process for the preparation of initiators which can be used in novel curable compositions which compositions can be cured without the addition of sensitisers under the action of light and/or heat.

These curable compositions comprise
(A) a cationically polymerisable organic material and
(B) at least one compound of the formula I

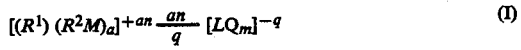

wherein a is 1 or 2, n is 1 or 2 and q is an integer from 1 to 3, M is the $Fe^{2+}$ cation, m is an integer corresponding to the valency of $L+q$, Q is a halogen atom, L is a divalent to heptavalent metal or non-metal, $R^1$ is a π-arene and $R^2$ is a π-arene or the anion of a π-arene.

Possible π-arenes $R^1$ and $R^2$ are, in particular, aromatic groups of 6 to 24 carbon atoms or heteroaromatic groups of 3 to 30 carbon atoms, which groups may be unsubstituted or mono- or polysubstituted by identical or different monovalent radicals such as halogen atoms, preferably chlorine or bromine atoms, or $C_1$–$C_8$alkyl, $C_1$–$C_8$alkoxy, cyano, $C_1$–$C_8$alkylthio, $C_2$–$C_6$monocarboxylic acid alkyl ester, phenyl, $C_2$–$C_5$alkanoyl or benzoyl groups. These π-arene groups may be mononuclear, condensed polynuclear or non-condensed polynuclear systems, in which last-mentioned systems the nuclei may be linked together direct or through bridge members such as —S— or —O—.

$R^2$ as the anion of a π-arene may be an anion of a π-arene of the aforementioned kind, e.g. the indenyl anion, and, in particular, the cyclopentadienyl anion, which anions may also be unsubstituted or mono- or polysubstituted by identical or different monovalent radicals such as $C_1$–$C_8$alkyl, $C_2$–$C_6$monocarboxylic acid alkyl ester, cyano, $C_2$–$C_5$alkanoyl or benzoyl groups.

Alkyl, alkoxy, alkylthio, monocarboxylic acid alkyl ester and alkanoyl substituents may be straight chain or branched. Typical alkyl, alkoxy, alkylthio, monocarboxylic acid alkyl ester or alkanoyl substituents are: methyl, ethyl, n-propyl, isopropyl, n-butyl, sec-butyl, tert-butyl, n-pentyl, n-hexyl, n-octyl, methoxy, ethoxy, n-propoxy, isopropoxy, n-butoxy, n-hexyloxy, n-octyloxy, methylthio, ethylthio, n-propylthio, isopropylthio, n-butylthio, n-pentylthio and n-hexylthio, carboxylic acid methyl ester, ethyl ester, n-propyl ester, isopropylester, n-butyl ester and n-pentyl ester, acetyl, propionyl, butyryl, and valeroyl. Alkyl, alkoxy, alkylthio and monocarboxylic acid alkyl ester groups containing 1 to 4 and especially 1 or 2 carbon atoms in the alkyl moieties and alkanoyl groups containing 2 or 3 carbon atoms are preferred. Preferred substituted π-arenes or anions of substituted π-arenes are those containing one or two of the above-mentioned substituents, in particular chlorine or bromine atoms, methyl, ethyl, methoxy, ethoxy, cyano, carboxylic acid methyl or ethyl ester groups and acetyl groups.

$R^1$ and $R^2$ may be identical or different π-arenes. Suitable heteroaromatic π-arenes are systems containing S-, N- and/or O-atoms. Heteroaromatic π-arenes containing S and/or O-atoms are preferred. Examples of suitable π-arenes are: benzene, toluene, xylenes, ethylbenzene, methoxybenzene, ethoxybenzene, dimethoxybenzene, p-chlorotoluene, chlorobenzene, bromobenzene, dichlorobenzene, acetylbenzene, trimethylbenzene, trimethoxybenzene, naphthalene, 1,2-dihydronaphthalene, 1,2,3,4-tetrahydronaphthalene, methylnaphthalenes, methoxynaphthalenes, ethoxynaphthalenes, chloronaphthalenes, bromonaphthalenes, biphenyl, indene, biphenylene, fluorene, phenanthrene, anthracene, 9,10-dihydroanthracene, triphenylene, pyrene, naphthacene, coronene, thiophene, chromene, xanthene, thioxanthene, benzothiophene, naphthothiophene, thianthrene, diphenylene oxide, diphenylene sulphide, acridine and carbazole.

If a is 2, then each $R^2$ is preferably the anion of a π-arene, and each M is an identical metal atom. Examples of anions of substituted π-arenes are: the anions of methyl-, ethyl-, n-propyl- and n-butylcyclopentadiene, the anions of dimethylcyclopentadiene, of cyclopentadiene carboxylic acid methyl ester and ethyl ester, and of acetylcyclopentadiene, propionylcyclopentadiene, cyanocyclopentadiene and benzoylcyclopentadiene. Preferred anions are the anion of unsubstituted indenyl and especially the anion of unsubstituted cyclopentadiene.

The preferred value of a is 1, $R^1$ is benzene, toluene, xylene, methoxybenzene, chlorobenzene, p-chlorotoluene, naphthalene, methylnaphthalene, chloronaphthalene, methoxynaphthalene, biphenyl, indene, pyrene or diphenylene sulfide, and $R^2$ is the anion of cyclopentadiene, acetylcyclopentadiene or indene, or benzene, toluene, xylene, trimethylbenzene, naphthalene or methylnaphthalene.

Particularly preferred are complexes of formula I, wherein a is 1, $R^1$ is $\eta^6$-pyrene or $\eta^6$-naphthalene, and $R^2$ is the anion of $\eta^5$-cyclopentadiene, n is preferably 1 or 2, especially 1, and q is preferably 1.

Examples of suitable metals or non-metals L are Sb, Fe, Sn, Bi, Al, Ga, In, Ti, Zr, Sc, V, Cr, Mn and Cs; lanthanides such as Ce, Pr and Nd, or actinides, such as Th, Pa, U or Np. Suitable non-metals are especially B, P and As. Preferably L is P, As, B or Sb, with P being most preferred.

Examples of complex anions $[LQ_m]^{-q}$ are $BF_4^-$, $PF_6^-$, $AsF_6^-$, $SbF_6^-$, $FeCl_4^-$, $SnCl_6^{2-}$, $SbCl_6^-$, $BiCl_6^-$. The most preferred complex anions are $SbF_6^-$, $BF_4^-$, $AsF_6^-$ and $PF_6^-$.

The compounds of formula I may be prepared by methods known per se, e.g. by reacting a compound of formula II

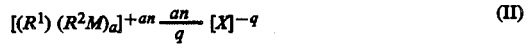

with a salt of an anion $[LQ_m]^{-q}$, wherein a, m, n, q, $R^1$, $R^2$, M and L are as defined for formula I and $[X]^{-q}$ is an anion which differs from $[LQ_m]^{-q}$.

Both the compounds of formula II and the compounds of formula III

wherein a and M are as defined above, $R^{1'}$ is a π-arene or the anion of a π-arene and $R^2$ is an anion of a π-arene, may be prepared by reacting identical or different π-arenes in the presence of a Lewis acid with a salt of $Fe^{2+}$. Compounds of formulae I, II and III are also suitable for effecting ligand exchange, by reacting said compounds in the presence of a Lewis acid with a π-arene which differs from $R^1$ and/or $R^2$ and $R^{1'}$ respectively. In these cases, n is preferably 2 and most preferably 1.

Compounds of formula I wherein L is a metal may also be obtained by reacting identical or different π-arenes in the presence of a Lewis acid with a suitable iron salt. Finally, compounds of formula I may also be converted in conventional manner into complexes of formula I having a different anion $[LQ_m]^{-q}$, by means of anion exchange.

In a preferred embodiment, uncharged π-complexes of formula III, e.g. ferrocene or bis-($\eta^5$-indenyl) iron-(II), are used as starting materials, and these are converted by ligand exchange into a complex of formula II, which complex is subsequently reacted with a salt of an anion $[LQ_m]^{-q}$. In this reaction, the complex of the formula II obtained as intermediate is usually not isolated.

Suitable salts of anions $[LQ_m]^{-q}$ are, e.g. alkali metal, alkaline earth metal or ammonium salts. It is preferred to use alkali metal salts, most preferably sodium and potassium salts.

Suitable Lewis acids for the above-described reactions are e.g. $AlCl_3$, $AlBr_3$, $BF_3$, $SnCl_4$ and $TiCl_4$. It may be advantageous to perform the ligand exchange reactions by adding a reducing agent to the reaction mixture, e.g. aluminium or magnesium, or subsequently to add a reducing agent to the reaction mixture, e.g. $Na_2SO_3$ or ascorbic acid. Aluminium us the preferred reducing agent.

In an especially preferred embodiment of the invention compounds of the formula Ia are prepared

wherein $R^1$, L, Q, m and q are as defined above and $R^{2'}$ is an anion of a π-arene said process comprises reacting an uncharged π-complex of the formula IIIa

with a π-arene $R^1$ in the presence of Al and a Lewis-acid followed by treatment with an acid or a salt of an acid of the anion $[LQ_m]^{q\ominus}$, the improvement consisting essentially of using $TiCl_4$ as a Lewis-acid.

When using $TiCl_4$ as a catalyst in the ligand-exchange reactions considerably higher yields of reaction products are obtained as compared to the analogous reaction wherein $AlCl_3$ is used. The ligand exchange reactions are conveniently carried out in an inert organic solvent. Examples of suitable solvents are aliphatic or cycloaliphatic hydrocarbons such as octane, nonane, decane and cyclohexane. If desired, an excess of π-arene may also be used as solvent.

The reaction of the compounds of formula II with a salt of an anion $[LQ_m]^{-q}$ and the anion exchange conversion of compounds of formula I are conveniently conducted in an aqueous or aqueous-alcoholic medium, e.g. in mixtures of water and methanol or ethanol. The salts of the anions $[LQ_m]^{-q}$ are used in at least stoichiometric amounts, but preferably in excess thereof.

Cationically polymerisable organic materials which are polymerized by the initiators prepared in the process of the invention are e.g. those of the following kind: They may be used alone or as mixtures of at least two components.

I. Ethylenically unsaturated compounds which are polymerisable by a cationic mechanism. Such compounds comprise
  1. Mono- and diolefins, e.g. isobutylene, butadiene, isoprene, styrene, α-methylstyrene, divinylbenzenes, N-vinylpyrrolidone, N-vinylcarbazole and acrolein.
  2. Vinyl ethers, e.g. methyl vinyl ether, isobutyl vinyl ether, trimethylolpropane trivinyl ether, ethylene glycol divinyl ether; cyclic vinyl ethers, e.g. 3,4-dihydro-2-formyl-2H-pyrane (dimeric acrolein), 3,4-dihydro-2H-pyrane-2-carboxylic acid ester of 2-hydroxymethyl-3,4-dihydro-2H-pyrane.
  3. Vinyl esters, e.g. vinyl acetate and vinyl stearate.
II. Cationically polymerisable heterocyclic compounds, e.g. ethylene oxide, propylene oxide, epichlorohydrin, glycidyl ethers of monohydric alcohols or phenols, e.g. n-butyl glycidyl ether, n-octyl glycidyl ether, phenyl glycidyl ether, cresyl glycidyl ether; glycidyl acrylate, glycidyl methacrylate, styrene oxide and cyclohexene oxide; oxetanes such as 3,3-dimethyloxetane and 3,3-di-(chloromethyl)oxetane; tetrahydrofuran; dioxolanes, trioxan and 1,3,6-trioxacyclooctane; lactones such as β-propiolactone, γ-valerolactone and ε-caprolactone; thiiranes such as ethylene sulfide and propylene sulfide; azetidines such as N-acylazetidines, e.g. N-benzoylazetidine, as well as the adducts of azetidine with diisocyanates, e.g. toluylene-2,4- and 2,6-diisocyanate and 4,4'-diaminodiphenylmethane diisocyanate; epoxy resins; linear and branched polymers containing glycidyl groups in the side chains, e.g. homo- and copolymers of polyacrylate and polymethacrylate glycidyl esters.

Compounds of particular importance amongst these polymerisable compounds cited above are the epoxy resins, more particularly the di- and polyepoxides and epoxide resin prepolymers of the type used for the preparation of crosslinked epoxy resins. The di- and polyepoxides may be aliphatic, cycloaliphatic or aromatic compounds. Examples of such compounds are the glycidyl ethers and $\beta$-methylglycidyl ethers of aliphatic or cycloaliphatic diols or polyols, for example those of ethylene glycol, propane-1,2-diol, propane-1,3-diol, butane-1,4-diol, diethylene glycol, polyethylene glycol, polpropylene glycol, glycerol, trimethylolpropane or 1,4-dimethylolcyclohexane or of 2,2-bis-(4-hydroxycyclohexyl)-propane and N,N-bis-(2-hydroxyethyl)-aniline; the glycidyl ethers of di- and polyphenols, for example of resorcinol, 4,4'-dihydroxydiphenylmethane, 4,4'-dihydroxydiphenyl-2,2-propane, novolacs and 1,1,2,2-tetrakis-(4-hydroxyphenyl)ethane. Further examples are N-glycidyl compounds, for example the digylcidyl compounds of ethyleneurea, 1,3-propyleneurea or 5-dimethylhydantoin or of 4,4'-methylene-5,5'-tetramethyldihydantoin, or such as triglycidyl isocyanurate.

Further glycidyl compounds of technical importance are the glycidyl esters of carboxylic acids, in particular of di- and polycarboxylic acids. Examples are the glycidyl esters of succinic acid, adipic acid, azelaic acid, sebacic acid, phthalic acid, terephthalic acid, tetra- and hexahydrophthalic acid, isophthalic acid or trimellitic acid, or of dimerised fatty acids.

Examples of polyepoxides which are not glycidyl compounds are the diepoxides of vinylcyclohexane, dicyclopentadiene, 3-(3',4'-epoxycyclohexyl)-8,9-epoxy-2,4-dioxaspiro[5.5]undecane, 3,4-epoxycyclohexanecarboxylic acid of 3',4'-epoxycyclohexylmethyl ester, butadiene diepoxide or isoprene diepoxide, epoxidised linoleic acid derivatives or epoxidised polybutadiene.

Preferred epoxy resins are diglycidyl ethers, which may have been advanced, of divalent phenols or of divalent aliphatic alcohols containing 2 to 4 carbon atoms. Particularly preferred are the diglycidyl ethers, which may have been advanced, of 2,2-bis-(4-hydroxyphenyl)-propane and bis-(4-hydroxyphenyl)-methane.

Further cationically polymerisable compounds which may be used are:

III. Methylol compounds:

1. Aminoplasts such as the N-hydroxymethyl, N-methoxymethyl, N-n-butoxymethyl and N-acetoxymethyl derivatives of amides or amide type compounds, e.g. cyclic ureas such as ethyleneurea(imidazolidin-2-one), hydantoin, uron(tetrahydro-oxadiazin-4-one), 1,2-propyleneurea(4-methylimidazolidin-2-one), 1,3-propyleneurea(hexahydro-2H-pyrimid-2-one), hydroxypropyleneurea(5-hydroxyhexahydro-2H-pyrimid-2-one), 1,3,5-melamine and further polytriazines such as acetoguanamine, benzoguanamine and adipoguanamine.

If desired, aminoplasts containing both N-hydroxymethyl and N-alkoxymethyl, or N-hydroxymethyl and N-acetoxymethyl, groups may be used (for example, a hexamethylolmelamine in which 1 to 3 of the hydroxyl groups have been etherified with methyl groups).

The preferred aminoplasts are condensation products of urea, uron, hydantoin, or melamine with formaldehyde, and partially or fully etherified products of such condensation products with an aliphatic monohydric alcohol of 1 to 4 carbon atoms.

2. Phenoplasts

The preferred phenoplasts are resols made from a phenol and an aldehyde. Suitable phenols include phenol itself, resorcinol, 2,2-bis(p-hydroxyphenyl)propane, p-chlorophenol, a phenol substituted by one or two alkyl groups each of 1 to 9 carbon atoms, such as o-, m-, and p-cresol, the xylenols, p-tertiary butylphenol, and p-nonylphenol, and also phenyl-substituted phenols, especially p-phenylphenol. The aldehyde which is condensed with the phenol is preferably formaldehyde, but other aldehydes such as acetaldehyde and furfuraldehyde may also be used. If desired, a mixture of such curable phenol-aldehyde resins may be used.

The preferred resols are condensation products of phenol, p-chlorophenol, resorcinol, or o-, m-, or p-cresol with formaldehyde.

The curable compositions containing the initiators prepared in this invention may be obtained in any form, e.g. as homogeneous liquid mixtures or in homogeneous or inhomogeneous glassy form. Homogeneous glassy products may be prepared in a manner known per se e.g. by liquifying solid polymerisable organic materials, optionally with the addition of suitable solvents in the dark or under red light, by heating them to temperatures above their glass transition temperatures, adding the initiator of the formula I, and cooling the resultant mixtures. If desired, the glassy products so obtained may subsequently be comminuted. Inhomogeneous glassy products may be obtained e.g. by mixing glassy polymerisable materials in powder form with initiators prepared from the process of this invention.

The curable compositions obtained from the initiators prepared from the process of the invention are storage stable for a considerable time at room temperature in relative darkness, e.g. in red light. Depending on their composition and intended end use, e.g. for making coatings or films, they may be heat-cured direct. The temperatures for direct heat-curing are preferably close to the melting temperature of the initiator employed. The heat-curing is normally complete after about 3 to 10 minutes.

Particularly preferred is two-stage polymerisation (curing), by first activating the initiator of the formula I by irradiating the curable compositions and subsequently heat-curing the activated precursors so obtained, the irradiation temperature being below the temperature employed for the subsequent heat-curing. These activated precursors may normally be cured at temperatures which are substantially lower than those required for the direct heat-curing, with advantage in the range from 50° to 110° C. This two-stage curing also makes it possible to control the polymerisation in a particularly simple and advantageous manner. In addition, activated precursors obtainable from glassy curable compositions containing the initiators prepared in the process of this invention are storage stable for a considerable time at room temperature even under light conditions, in contrast to known cationically polymerisable compositions of the prior art, e.g. those which contain sulfonium or iodonium salts as initiators. This feature constitutes a further substantial advantage of the two-stage curing and of these activated precursors. Activated precursors obtainable from liquid curable compositions containing the initiators prepared in the process of the invention are generally of only limited storage stability under light conditions and are advantageously further used direct.

The irradiation of the curable mixtures to produce the activated precursors is conveniently effected with an electron beam or with actinic light, preferably having a wavelength of 200 to 600 nm and a strength of 150 to 5000 watts. Suitable light sources are e.g. xenon lamps, argon lamps, tungsten lamps, carbon arcs, metal halide and metal arc lamps such as mercury low pressure, medium pressure and high pressure lamps. It is preferred to carry out the irradiation with metal halide or mercury high pressure lamps. The irradiation time depends on different factors, including e.g. the polymerisable organic material, the nature of the light source and its distance from the irradiated material. The irradiation time is advantageously from 10 to 60 seconds.

Heating of the exposed compositions may occur in conventional convexion ovens. When a short time for heating up or short reaction times are required, heating may be effected by exposure with for example IR-radiation, IR-lasers or micro wave equipments.

The curable compositions and the activated precursors obtainable therefrom may also contain further additives known and conventionally employed in the technology of photopolymerisable materials. Examples of such additives are pigments, dyes, fillers and reinforcing agents, glass fibres and other fibres, flame retardants, antistats, levelling agents, antioxidants and light stabilisers.

For increasing the storage stability in the darkness, the curable compositions and the activated precursors may contain weak organic bases like nitriles, amides, lactones or urea derivatives. To avoid a premature reaction because of unintended exposure, UV-absorbers and/or organic dyes may be added in small amounts.

The curable composition and the activated precursors may additionally contain mono- or polyfunctional compounds or resins which are cured by a radical mechanism. Examples are acrylate and/or methacrylate esters of aliphatic polyoles. The curing reaction of these substances is initiated by radical forming (photo)initiators or electron beams. Initiators, which are activated by heat, are for example peroxides or azo compounds. Initiators activated by exposure are for example acetophenones, acylphosphineoxides or aromatic ketones. To improve the end properties of the epoxide resins, polyfunctional hydroxy compounds for example as described in DE-OS No. 2 639 395 may be incorporated.

A substantial advantages of the curable compositions containing the initiators prepared in the process of the present invention and of the activated precursors obtainable from said compositions is that, even when using brief curing times, the use of conventional photosensitisers may be dispensed with.

These curable compositions and the activated precursors obtainable therefrom are suitable e.g. for the production of surface coatings on different substrates. For this utility they are preferably employed in liquid form. Examples of suitable substrates are metals such as steel, aluminium, copper, cadmium and zinc, ceramics, glass, plastics, paper or wood.

If in the two-stage polymerisation described above initially only a part of the coating is irradiated through a mask, then the areas which have not been exposed may be removed with a suitable solvent after a subsequent brief heat-curing. These curable compositions are therefore suitable for image reproduction or for the production of printing plates and, in particular, of printed circuits (photo-resists) by methods which are known per se (q.v. for example British patent specification No. 1 495 746).

The curable compositions and the activated precursors obtainable therefrom may also be used as adhesives or for making putties, fillers or fibre-reinforced composites and laminates. Further, it is possible to cure the curable compositions which contain an epoxy resin or a phenoplast as polymerisable material, in two stages.

The procedure is that the mixture of initiator of the formula I and epoxy resin or phenoplast is first converted into the partially cured B-stage by irradiation in the presence of a latent, heat-activated crosslinking agent for the epoxy resin or phenoplast. The partially cured composition so obtained is then heated in a second stage so that curing is completed. It is preferred to use a polycarboxylic anhydride as latent, heat-activated crosslinking agent. The curable compositions containing the initiators prepared in the process of this invention which contain epoxy resins or phenoplasts are suitable in particular for making printed circuits, filament windings, moulding compositions or adhesive films (q.v. for example published European patent application No. 44274, wherein such known utilities are described in detail).

For the above utilities, the curable compositions or the activated precursors obtainable therefrom, conveniently contain 0.1 to 15% by weight, preferably 0.5 to 5% by weight, based on the polymerisable organic material (A), of at least one compound of the formula I.

Of particular interest also are homogeneous, glassy, curable compositions and activated precursors obtainable therefrom, which contain up to equimolar amounts of an initiator of the formula I and a polymerisable organic material (A), in which connection "equimolar" will be understood to mean the reactive group of the polymerisable organic material. Such mixtures may be used as hardeners for cationically polymerisable materials of the kind specified above, in particular epoxy resins. Non-activated curable mixtures of this type are advantageously added direct to glassy cationically polymerisable materials and heat-cured in the aforementioned manner. Corresponding activated precursors are suitable as hardeners for cationically polymerisable material, in liquid or solid (glassy) form.

EXAMPLES 1 TO 3

0.1 moles ferrocene, 0.1 moles aromatic compound and 0.1 moles Al-powder are stirred at 60° C. in 100 ml octane-fraction until all of the ferrocene is dissolved. Then 0.2 moles of the corresponding Lewis-acid are added under stirring. The reaction mixture is heated up to 110° C. and is stirred for 5 hours at this temperature.

The warm reaction mixture is poured onto 500 g ice containing 10 ml conc. hydrochlorid acid and is stirred for 30 minutes. After filtration and phase separation a concentrated solution of an acid or of an salt thereof (e.g. $KPF_6$ or $HPF_6$) is dropped to the resulting mixture. The precipitating solid is separated by filtration, washed with water and dried at 40° C. (under vacuum; 13 $mN/m^2$). The results are given in the following table:

| Example No. | complex | AlCl$_3$— catalyst % reaction-yield | TiCl$_4$— catalyst % reaction-yield |
|---|---|---|---|
| 1 | 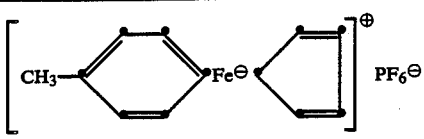 | 40$^{(1)}$ | 75.3 |
| 2 | 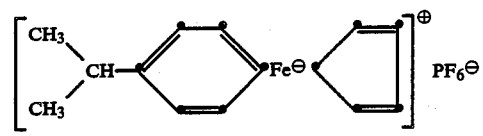 | 20$^{(1)}$ | 63.8 |
| 3 | 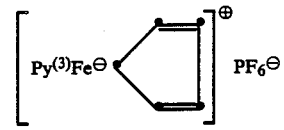 | 24$^{(2)}$ | 79.3 |

$^{(1)}$comp. C. R. Acad. Sc. Paris, Ser. C, 272, 1337 (1971)
$^{(2)}$comp. Can. J. Chem., 57, 933 (1979)
$^{(3)}$Py is a mixture of pyrene and partially hydrogenated pyrenes (as discussed in Can. J. Chem. 57, 933); $^1$H—NMR investigation of the products demonstrates that a lower quantity of partially hydrogenated pyrenes is formed in the TiCl$_4$ process as compared with the AlCl$_3$ process

What is claimed is:

1. In the process for the preparation of a salt of an iron complex of the formula:

[R$^1$FeR$^{2'}$]$^+$$_q$[LQ$_m$]$^{q-}$ wherein
R$^1$ is a π-arene;
R$^{2'}$ is an anion of a π-arene;
L is a divalent to heptavalent metal or non-metal;
Q is a halogen atom;
q is 1, 2, or 3; and
m is the sum of q and the valency of L;
in which an uncharged π-complex of the formula:

[R$^{2'}$FeR$^{2'}$]

is allowed to react with a π-arene R$^1$ in the presence of aluminum and a Lewis acid and the reaction product is treated with a source of the anion [LQ$_m$]$^{q-}$,
the improvement which comprises employing an effective amount up to a one molar excess of the Lewis acid titanium tetrachloride per mol of said uncharged π-complex.

2. The process of claim 1 wherein R$^{2'}$ is a cyclopentadienyl anion.

* * * * *